US010564225B2

United States Patent
Yamazaki et al.

(10) Patent No.: US 10,564,225 B2
(45) Date of Patent: Feb. 18, 2020

(54) BATTERY MONITORING SYSTEM, SIGNAL TRANSMISSION METHOD, AND SEMICONDUCTOR DEVICE FOR MONITORING BATTERIES

(71) Applicant: LAPIS Semiconductor Co., Ltd., Yokohama (JP)

(72) Inventors: Masato Yamazaki, Yokohama (JP); Hidekazu Kikuchi, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 50 days.

(21) Appl. No.: 16/012,877

(22) Filed: Jun. 20, 2018

(65) Prior Publication Data

US 2018/0372804 A1    Dec. 27, 2018

(30) Foreign Application Priority Data

Jun. 23, 2017   (JP) ................................. 2017-123661

(51) Int. Cl.
*G01R 31/36*    (2019.01)
*G01R 31/396*   (2019.01)
*G01R 31/319*   (2006.01)

(52) U.S. Cl.
CPC .......... *G01R 31/396* (2019.01); *G01R 31/36* (2013.01); *G01R 31/3648* (2013.01); *G01R 31/31901* (2013.01)

(58) Field of Classification Search
CPC .. G01R 31/00; G01R 31/31901; G01R 31/36; G01R 31/3644; G01R 31/3648; G01R 31/396; G01R 35/00; H02J 7/00; H02J 7/0029; H02J 7/0031

USPC ............... 324/425, 426, 434, 500, 537, 555; 320/127, 128, 134, 135, 136; 702/1, 57, 702/60, 63

See application file for complete search history.

(56) References Cited

U.S. PATENT DOCUMENTS

| 5,745,779 A * | 4/1998 | Katori ............... G06F 15/17381 709/200 |
| 2008/0174463 A1* | 7/2008 | Daito ................... G09G 3/3688 341/150 |

(Continued)

FOREIGN PATENT DOCUMENTS

JP    2013-104842 A    5/2013

*Primary Examiner* — Hoai-An D. Nguyen
(74) *Attorney, Agent, or Firm* — Rabin & Berdo, P.C.

(57) ABSTRACT

A battery monitoring system includes a plurality of battery monitoring devices connected in series, such that each battery monitoring device is in communication with at least one adjacent battery monitoring device, and each battery monitoring device monitors battery cells. First and second interface devices are located along first and second communication paths including the battery monitoring devices. A controller controls the first and second interface devices to switch transmission modes between transmitting along the first communication path via the first interface device and the battery monitoring devices, transmitting along the second communication path via the second interface device and the battery monitoring devices, and transmitting along a third transmission mode in which a direction of the communication signals outputted from the first interface device and the second interface device to the plurality of battery monitoring devices are reversed.

12 Claims, 6 Drawing Sheets

(56) References Cited

U.S. PATENT DOCUMENTS

| | | | |
|---|---|---|---|
| 2008/0176120 A1* | 7/2008 | Dong | H01M 8/04559 429/432 |
| 2011/0037432 A1* | 2/2011 | Sakurai | H01M 10/482 320/118 |
| 2011/0057659 A1* | 3/2011 | Ishikawa | G01R 31/396 324/434 |
| 2012/0250203 A1* | 10/2012 | Makihara | G01R 31/3835 361/86 |
| 2013/0147445 A1* | 6/2013 | Levesque | G05F 1/595 323/271 |

* cited by examiner

BATTERY MONITORING SYSTEM, SIGNAL TRANSMISSION METHOD, AND SEMICONDUCTOR DEVICE FOR MONITORING BATTERIES

TECHNICAL FIELD

The present invention relates to a battery monitoring system, a signal transmission method, and a semiconductor device for monitoring batteries.

BACKGROUND ART

Secondary batteries such as lithium-ion batteries are installed in hybrid electric vehicles (HEVs) and electric vehicles (EVs). In HEVs and EVs, high voltages are required in order to increase the efficiency of the inverter and the motor. Thus, multiple secondary batteries are connected together. In particular, in lithium-ion batteries, each of the multiple battery cells connected together need to be monitored in order to prevent overcharging and over discharging. A plurality of battery monitoring ICs (integrated circuits) are used in order to monitor the multiple connected battery cells.

Japanese Patent Application Laid-Open Publication No. 2013-104842, for example, discloses a battery monitoring device that includes: a plurality of monitoring means that are provided for each of a plurality of battery modules that constitute a battery assembly, that each monitor the corresponding battery module, and that output monitoring results as an output signal; and a control means that outputs a control signal instructing the plurality of monitoring means to monitor the corresponding battery modules, and that acquires output signals from the plurality of monitoring means. In this battery monitoring device, the plurality of monitoring means are connected in a daisy chain through a first signal line for allowing transmission of the control signal and output signal, and, among the plurality of monitoring means, the high voltage monitoring means corresponding to the battery module on the highest voltage side and the low voltage monitoring means corresponding to the battery module on the lowest voltage side are connected through a second signal line. The control means is connected through an insulated signal transmission means to either the high voltage monitoring means or the low voltage monitoring means, and if there is a break in the first signal line, then the output signal can be acquired through the second signal line.

SUMMARY OF THE INVENTION

Problems to be Solved by the Invention

One solution to ensure reliability of communication between the plurality of battery monitoring ICs and control devices such as MCUs (microcontroller units) that control the battery monitoring ICs is to provide redundancy for the communication path formed between the plurality of battery monitoring ICs and the control device. In other words, by providing a first communication path that passes through the plurality of battery monitoring ICs and a second communication path differing from the first communication path, then even if signal transmission through the first communication path were rendered impossible, for example, it is possible to ensure communication between the plurality of battery monitoring ICs and the control device by switching to the second communication path. However, there was a problem that if a fault were to occur in any of the battery monitoring ICs, then regardless of whether the first communication path or the second communication path were used, communication would be rendered impossible for the battery monitoring IC in which the fault occurred as well as battery monitoring ICs disposed downstream thereof on the communication path.

The present invention takes into consideration the above-mentioned problem, and an object thereof is to provide a battery monitoring system including a plurality of battery monitoring devices in which, even if a fault occurs in some of the battery monitoring devices, communication with battery monitoring devices other than those in which the fault has occurred is ensured.

According to one embodiment, a battery monitoring system, includes a plurality of battery monitoring devices connected in series, such that each battery monitoring device is in communication with at least one adjacent battery monitoring device, and each battery monitoring device monitors battery cells. A first interface device is provided along a first communication path that passes through each of the plurality of battery monitoring devices, and a second interface device is provided along a second communication path that passes through each of the plurality of battery monitoring devices and differs from the first communication path. A controller is configured to control the first interface device and the second interface device to switch a transmission mode between a first transmission mode in which communication signals are transmitted and received between the first interface device and the plurality of battery monitoring devices are transmitted through the first communication path, a second transmission mode in which the communication signals are transmitted and received between the second interface device and the plurality of battery monitoring devices through the second communication path, and a third transmission mode in which a direction of the communication signals outputted from the first interface device to the plurality of battery monitoring devices are reversed, and a direction of the communication signals outputted from the second interface device to the plurality of battery monitoring devices are reversed.

According to one embodiment, a signal transmission method is performed in a battery monitoring system having a plurality of battery monitoring devices connected in series, such that each battery monitoring device is in communication with at least one adjacent battery monitoring device. Each battery monitoring device monitors battery cells. The monitoring system further includes a first interface device provided in a first communication path that passes through each of the plurality of battery monitoring devices and a second interface device that is provided in a second communication path that passes through each of the plurality of battery monitoring devices and differs from the first communication path. The method includes determining whether signal transmission along the first communication path in a first transmission mode and along the second communication path in a second transmission mode are impossible; and based on determining that the signal transmission is impossible in the first transmission mode and the second transmission mode, switching a transmission mode for transmitting signals to a third transmission mode in which a communication signal outputted from the first interface device is inputted to one end of the plurality of battery monitoring devices connected in series, reverses course at one of the plurality of battery monitoring devices, and is inputted to one of the first interface device and the second interface device, and a communication signal outputted from the second interface device is inputted to another end of the plurality of battery monitoring devices connected in series, reverses course at another of the plurality of battery monitoring devices, and is inputted to another of the first interface device and the second interface device.

According to one embodiment, a semiconductor device includes a processing unit that performs processing to measure a cell voltage of a battery cell connected to the semiconductor device, a first input terminal, a second input terminal different from the first input terminal, a first output terminal, and a second output terminal differing from the first output terminal, the first input terminal, second input terminal, first output terminal, and second output terminal communicating with an external device. The semiconductor device further includes a switch configured to switch an output destination of a response signal to a signal inputted to the first input terminal and the second input terminal to either the first output terminal or the second output terminal.

According to embodiments of the present invention, it is possible to provide a battery monitoring system including a plurality of battery monitoring devices in which, even if a fault occurs in some of the battery monitoring devices, communication with battery monitoring devices other than those in which the fault has occurred is ensured.

DETAILED DESCRIPTION OF EMBODIMENTS

Figure 1:
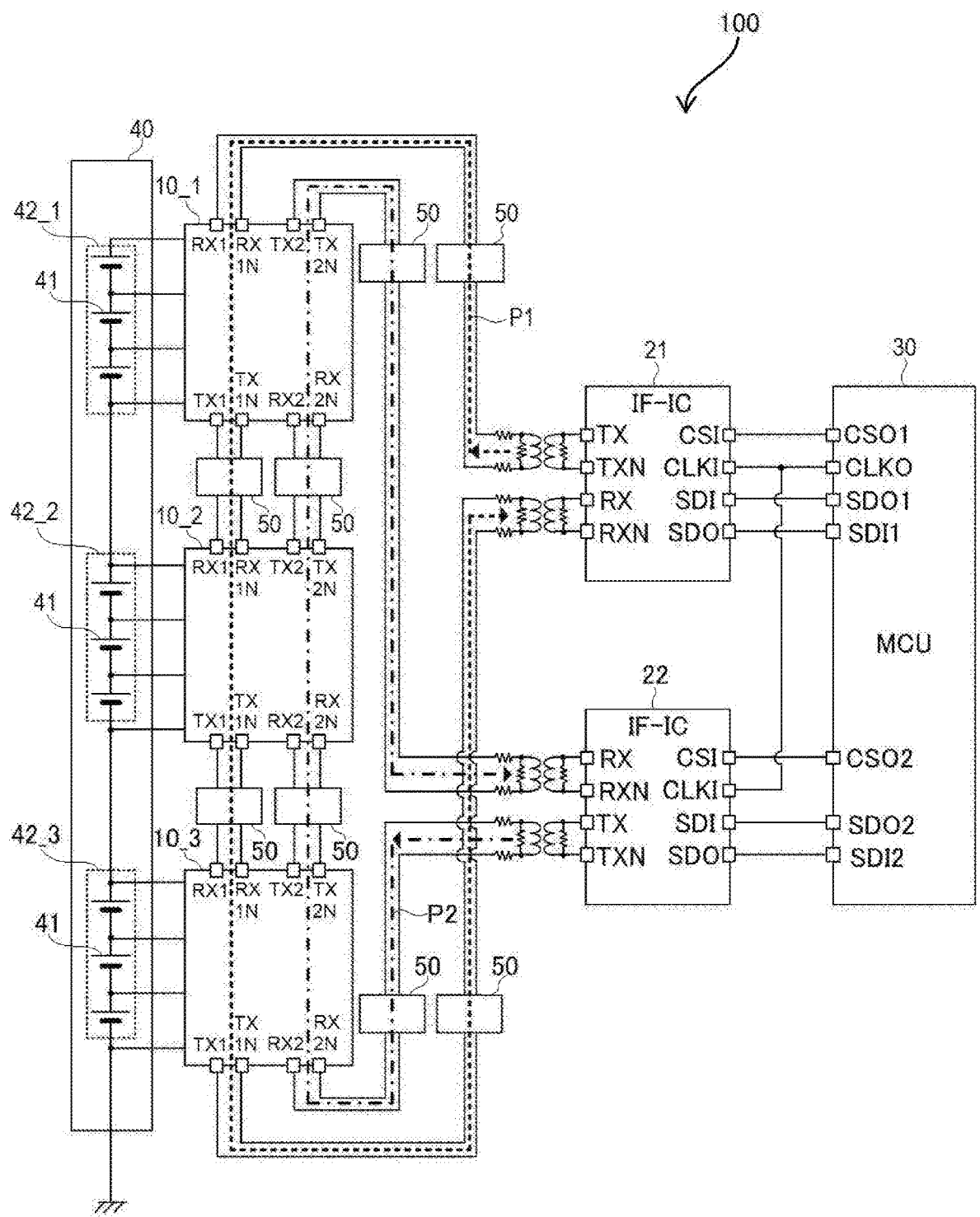
FIG. 1 shows a configuration of a battery monitoring system according to an embodiment of the present invention.

Embodiments of the present invention will be explained below with reference to the drawings. Substantially same or equivalent components or portions in the drawings are assigned the same reference characters.

Embodiment 1

FIG. 1 shows a configuration of a battery monitoring system 100 according to Embodiment 1 of the present invention. The battery monitoring system 100 is a system for monitoring the state of each battery cell 41 in a battery assembly 40 including a plurality of the battery cells 41 that are connected in series, the battery monitoring system being constituted of the battery assembly 40, a plurality of battery monitoring ICs 10_1, 10_2, and 10_3, a first interface IC 21, a second interface IC 22, and a microcontroller unit (MCU) 30. The plurality of battery monitoring ICs 10_1, 10_2, and 10_3, the first interface IC 21, the second interface IC 22, and the MCU 30 are formed on separate semiconductor chips, and are formed as separate semiconductor devices. In the present embodiment, an example is shown of a case in which the state of the battery cells is monitored by three battery monitoring ICs 10_1, 10_2, and 10_3, but the number of battery monitoring ICs can be appropriately increased or decreased according to the number of battery cells 41 included in the battery assembly 40.

The MCU 30 sends various commands to the battery monitoring ICs 10_1, 10_2, and 10_3 by the SPI (serial peripheral interface) communication method, which is a type of serial communication method. In other words, the MCU 30 functions as a master device in the SPI communication method, and the battery monitoring ICs 10_1, 10_2, and 10_3 function as slave devices in the SPI communication method. The MCU 30 is constituted of a microcomputer including a CPU (central processing unit), ROM (read only memory), RAM (random access memory), and the like. The MCU 30 is connected through the first interface IC 21 and the second interface IC 22 to the battery monitoring ICs 10_1, 10_2, and 10_3 in a manner allowing communication therewith. The MCU 30 sends various commands to the battery monitoring ICs 10_1, 10_2, and 10_3 using a clock signal that is a serial signal, a data signal, and a chip select signal. The response signals outputted from the battery monitoring ICs 10_1, 10_2, and 10_3 on the basis of the commands are received by the MCU 30.

The clock signal is a signal for controlling the operation timing of the battery monitoring ICs 10_1, 10_2, and 10_3. In other words, the battery monitoring ICs 10_1, 10_2, and 10_3 operate in synchronization with the clock signal supplied from the MCU 30. The data signal can include commands to the battery monitoring ICs 10_1, 10_2, and 10_3, and identification information such as an address or ID corresponding to any of the battery monitoring ICs 10_1, 10_2, and 10_3. The chip select signal is a signal that causes the battery monitoring ICs 10_1, 10_2, and 10_3 to transition between an active state and an inactive state through level transition.

The MCU 30 has a clock signal output terminal CLKO that outputs the clock signal, data output terminals SDO1 and SDO2 that output the data signals, control output terminals CSO1 and CSO2 that output the chip select signal, and data input terminals SDI1 and SDI2 that receive response signals outputted from the battery monitoring ICs 10_1, 10_2, and 10_3.

The first interface IC 21 and the second interface IC 22 each have a control input terminal CSI, a clock signal input terminal CLKI, a data input terminal SDI, and a data output terminal SDO.

The control input terminal CSI of the first interface IC 21 is connected to the control output terminal CSO1 of the MCU 30. The clock signal input terminal CLKI of the first interface IC 21 is connected to the clock signal output terminal CLKO of the MCU 30. The data input terminal SDI of the first interface IC 21 is connected to the data output terminal SDO1 of the MCU 30. The data output terminal SDO of the first interface IC 21 is connected to the data input terminal SDI1 of the MCU 30.

The control input terminal CSI of the second interface IC 22 is connected to the control output terminal CSO2 of the MCU 30. The clock signal input terminal CLKI of the second interface IC 22 is connected to the clock signal output terminal CLKO of the MCU 30. The data input terminal SDI of the second interface IC 22 is connected to the data output terminal SDO2 of the MCU 30. The data output terminal SDO of the second interface IC 22 is connected to the data input terminal SDI2 of the MCU 30.

The first interface IC 21 and the second interface IC 22 each convert the clock signal, the data signal, and the chip select signal outputted from the MCU 30 to a pair of differential signals and output the differential signals to a pair of output terminals TX and TXN. Also, the first interface IC 21 and the second interface IC 22 include a pair of input terminals RX and RXN for receiving differential signal-format response signals outputted from the battery monitoring ICs 10_1, 10_2, and 10_3 and convert the inputted differential signal-format response signals to SPI signal-format signals, and output the converted signals to the data output terminal SDO.

In the present embodiment, the response to a signal outputted from the first interface IC or the second interface IC 22 is inputted to the other interface IC. Thus, it is necessary to synchronize the first interface IC and the second interface IC 22 to each other, and in the present embodiment, the clock signal outputted from the MCU 30 is shared between the first interface IC and the second interface IC 22. However, the present invention is not limited to this aspect, and a configuration may be adopted in which the MCU 30 includes two clock signal output terminals that output two clock signals that are synchronized to each other, and in such a case, one of the clock signal output terminals of the MCU 30 may be connected to the clock signal input terminal CLKI of the first interface IC 21 with the other clock signal output terminal of the MCU 30 being connected to the clock signal input terminal CLKI of the second interface IC 22.

The battery monitoring ICs 10_1, 10_2, and 10_3 are connected in series to form a daisy chain, and communication is enabled between adjacent battery monitoring ICs. The battery monitoring ICs 10_1, 10_2, and 10_3 have a pair of first input terminals RX1 and RX1N, a pair of second input terminals RX2 and RX2N, a pair of first output terminals TX1 and TX1N, and a pair of second output terminals TX2 and TX2N. The first input terminals RX1 and RX1N and the second input terminals RX2 and RX2N are terminals for receiving differential signals, and the first output terminals TX1 and TX1N and the second output terminals TX2 and TX2N are terminals for outputting differential signals.

The first input terminals RX1 and RX1N of the battery monitoring IC 10_1 are connected through an isolator 50 to the output terminals TX and TXN of the first interface IC 21. The second input terminals RX2 and RX2N of the battery monitoring IC 10_1 are connected through an isolator 50 to the second output terminals TX2 and TX2N of the battery monitoring IC 10_2. The first output terminals TX1 and TX1N of the battery monitoring IC 10_1 are connected through an isolator 50 to the first input terminals RX1 and RX1N of the battery monitoring IC 10_2. The second output terminals TX2 and TX2N of the battery monitoring IC 10_1 are connected through an isolator 50 to the input terminals RX and RXN of the second interface IC 22.

The first output terminals TX1 and TX1N of the battery monitoring IC 10_2 are connected through an isolator 50 to the first input terminals RX1 and RX1N of the battery monitoring IC 10_3. The second input terminals RX2 and RX2N of the battery monitoring IC 10_2 are connected through an isolator 50 to the second output terminals TX2 and TX2N of the battery monitoring IC 10_3.

The first output terminals TX1 and TX1N of the battery monitoring IC 10_3 are connected through an isolator 50 to the input terminals RX and RXN of the first interface IC 21. The second input terminals RX2 and RX2N of the battery monitoring IC 10_3 are connected through an isolator 50 to the output terminals TX and TXN of the second interface IC 22.

The isolator 50 has the function of providing insulation between opposing blocks with the isolator 50 therebetween (that is, between adjacent battery monitoring ICs or between a battery monitoring IC and an interface IC). The isolator 50 can be made of an insulating element such as a photocoupler, a transformer, or a capacitor.

The plurality of battery cells 41 are divided into groups such that each group includes a different set of three battery cells, for example, to form battery cell groups 42_1, 42_2, and 42_3. The battery monitoring IC 10_1 is provided in correspondence with the battery cell group 42_1 having the highest potential, and monitors each of the battery cells 41 included in the battery cell group 42_1. The battery monitoring IC 10_2 is provided in correspondence with the battery cell group 42_2, and monitors each of the battery cells 41 included in the battery cell group 42_2. The battery monitoring IC 10_3 is provided in correspondence with the battery cell group 42_3 having the lowest potential, and monitors each of the battery cells 41 included in the battery cell group 42_3. The number of battery cells 41 to be monitored by the battery monitoring ICs 10_1, 10_2, and 10_3 can be increased or decreased as appropriate.

Figure 2:
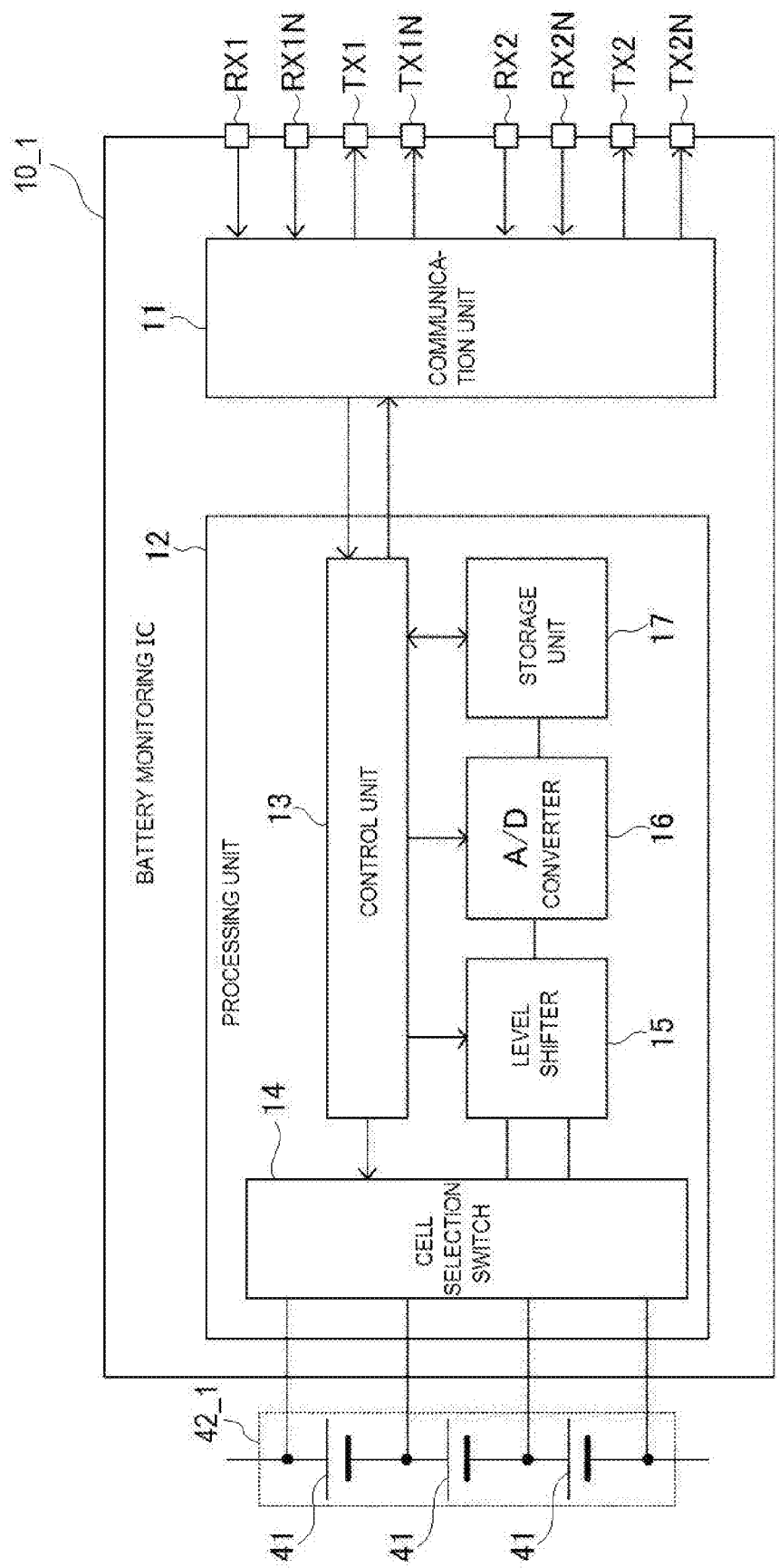
FIG. 2 is a block diagram showing an example of a configuration of a battery monitoring IC according to an embodiment of the present invention.

FIG. 2 is a block diagram showing an example of a configuration of the battery monitoring IC 10_1. The configurations of the battery monitoring ICs 10_2 and 10_3 are similar to that of the battery monitoring IC 10_1. The battery monitoring IC 10_1 includes a processing unit 12 and a communication unit 11. The processing unit 12 includes a control unit 13, a cell selection switch 14, a level shifter 15, an A/D converter 16, and a storage unit 17. The control unit 13 may include one or more processors, processor chips, or controllers, which may include a processor chip and memory. The control unit 13, or controller, includes processing circuitry, including logic circuitry, for receiving input signals, analyzing and processing the signals according to the physical arrangement of the logic circuit and instructions received from memory in the control unit 13, and generates output signals to control other elements in the processing unit 12 and the battery monitoring ICs 10.

The cell selection switch 14 selects one of the battery cells 41 to be monitored by the battery monitoring IC of the group to which it belongs, according to a control signal supplied from the control unit 13, and outputs a voltage to the positive electrode and the negative electrode of the selected battery cell. The level shifter 15 outputs a cell voltage, which is the difference between the positive electrode potential and the negative electrode potential of the battery cell 41 selected by the cell selection switch 14, at a level relative to ground potential. The A/D converter 16 outputs a digital value based on the cell voltage outputted from the level shifter 15. The storage unit 17 is a storage medium for storing the digital value of the cell voltage outputted from the A/D converter 16.

The communication unit 11 converts the differential signals inputted to the first input terminals RX1 and RX1N or the second input terminals RX2 and RX2N to the original clock signal, data signal, and chip select signal, and supplies these signals to the control unit 13.

The processing unit 12 performs a prescribed process on the basis of the clock signal, the data signal, and the chip select signal supplied from the communication unit 11. In other words, the processing unit 12 enters an active state according to the signal level of the chip select signal, and performs a process according to the command included in the data signal in synchronization with the clock signal. Specifically, if the identification information such as an address or ID included in the data signal supplied from the communication unit 11 corresponds to this battery monitoring IC, then the control unit 13 controls the cell selection switch 14, the level shifter 15, the A/D converter 16, and the storage unit 17 according to a command included in the data signal.

If the communication unit 11 has received processing results from the processing unit 12, then it converts these results to the differential signals and outputs the differential signals to the first output terminals TX1 and TX1N or the second output terminals TX2 and TX2N. If the identification information such as an address or ID included in the data signal does not correspond to this battery monitoring IC, then the communication unit 11 outputs the differential signals inputted to the first input terminals RX1 and RX1N or the second input terminals RX2 and RX2N, as is, from the first output terminals TX1 and TX1N or the second output terminals TX2 and TX2N.

The battery monitoring ICs 10_1, 10_2, and 10_3 are configured so as to be able to switch the output destination of the signals inputted to the first input terminals RX1 and RX1N or the second input terminals RX2 and RX2N or the response signals thereto to either the first output terminals TX1 and TX1N or the second input terminals TX2 and TX2N.

As shown in FIG. 1, the battery monitoring system 100 includes a first communication path P1 and a second communication path P2 as communication paths for performing communication between the MCU 30 and the battery monitoring ICs 10_1, 10_2, and 10_3.

The first communication path P1 passes through the output terminals TX and TXN of the first interface IC 21, the first input terminals RX1 and RX1N of the battery monitoring IC 10_1, the first output terminals TX1 and TX1N of the battery monitoring IC 10_1, the first input terminals RX1 and RX1N of the battery monitoring IC 10_2, the first output terminals TX1 and TX1N of the battery monitoring IC 10_2, the first input terminals RX1 and RX1N of the battery monitoring IC 10_3, the first output terminals TX1 and TX1N of the battery monitoring IC 10_3, and the input terminals RX and RXN of the first interface IC 21, in the stated order. That is, the first interface IC 21 is provided on the first communication path P1, and when performing signal transmission through the first communication path P1, the first input terminals RX1 and RX1N and the first output terminals TX1 and TX1N are used in each of the battery monitoring ICs 10_1, 10_2, and 10_3.

The second communication path P2 passes through the output terminals TX and TXN of the second interface IC 22, the second input terminals RX2 and RX2N of the battery monitoring IC 10_3, the second output terminals TX2 and TX2N of the battery monitoring IC 10_3, the second input terminals RX2 and RX2N of the battery monitoring IC 10_2, the second output terminals TX2 and TX2N of the battery monitoring IC 10_2, the second input terminals RX2 and RX2N of the battery monitoring IC 10_1, the second output terminals TX2 and TX2N of the battery monitoring IC 10_1, and the input terminals RX and RXN of the second interface IC 22, in the stated order. That is, the second interface IC 22 is provided on the second communication path P2, and when performing signal transmission through the second communication path P2, the second input terminals RX2 and RX2N and the second output terminals TX2 and TX2N are used in each of the battery monitoring ICs 10_1, 10_2, and 10_3. Also, the transmission direction of a signal passing through a plurality of battery monitoring ICs when performing signal transmission through the first communication path P1 is opposite to a case in which signal transmission is performed through the second communication path P2.

A transmission mode in which a communication signal transmitted and received between the first interface IC 21 or second interface IC 22 and the battery monitoring ICs 10_1, 10_2, and 10_3 is transmitted through the first communication path P1 will be referred to below as a first transmission mode. A transmission mode in which the communication signal is transmitted through the second communication path P2 will be referred to below as a second transmission mode. The communication signal includes a signal outputted from the first interface IC 21 or the second interface IC 22 on the basis of the signal outputted from the MCU 30, and a response signal outputted in response to the aforementioned signal from at least one of the battery monitoring ICs 10_1, 10_2, and 10_3.

In the battery monitoring system 100, if no fault has occurred in any of the battery monitoring ICs 10_1, 10_2, and 10_3, and these battery monitoring ICs are operating normally, then signal transmission is performed according to the first transmission mode or the second transmission mode. That is, if all of the battery monitoring ICs 10_1, 10_2, and 10_3 are operating normally, then signal transmission is performed through the first communication path P1 or the second communication path P2.

Below, an example will be described in which the signal transmission is performed according to the first transmission mode when a command to read the data of the cell voltage for the battery monitoring IC 10_2 is issued by the MCU 30. The command issued by the MCU 30 is converted to a pair of differential signals by the first interface IC 21 and outputted from the output terminals TX and TXN of the first interface IC 21. The differential signal-format command outputted from the first interface IC 21 is supplied to the battery monitoring IC 10_1. The command is transmitted from the battery monitoring IC 10_1 to the battery monitoring IC 10_2, and further transmitted from the battery monitoring IC 10_2 to the battery monitoring IC 10_3. In the first transmission mode, the signal transmission between battery monitoring ICs is performed using the first input terminals RX1 and RX1N and the first output terminals TX1 and TX1N.

When the battery monitoring IC 10_2 recognizes that identification information such as an address or an ID included in the received command refers to the battery monitoring IC 10_2 itself, then the battery monitoring IC 10_2 reads the data of the cell voltage stored in the storage unit 17 of the battery monitoring IC 10_2 and outputs the read data as a response signal to the command.

The response signal outputted from the battery monitoring IC 10_2 is transmitted to the battery monitoring IC 10_3. The battery monitoring IC 10_3 outputs the response signal received from the battery monitoring IC 10_2 from the first output terminals TX1 and TX1N. The response signal outputted from the battery monitoring IC 10_3 is inputted to the input terminals RX and RXN of the first interface IC 21.

The first interface IC 21 converts the format of the received response signal from the differential signal format to the serial signal (SPI signal) format and outputs the converted signal from the data output terminal SDO. The response signal outputted from the first interface IC 21 is inputted to the data input terminal SDI of the MCU 30.

Next, an example will be described in which the signal transmission is performed according to the second transmission mode when a command to read the data of the cell voltage for the battery monitoring IC 10_2 is issued by the MCU 30. The command issued by the MCU 30 is converted to a pair of differential signals by the second interface IC 22 and outputted from the output terminals TX and TXN of the second interface IC 22. The differential signal-format command outputted from the second interface IC 22 is supplied to the battery monitoring IC 10_3. The command is transmitted from the battery monitoring IC 10_3 to the battery monitoring IC 10_2, and further transmitted from the battery monitoring IC 10_2 to the battery monitoring IC 10_1. In the second transmission mode, the signal transmission between battery monitoring ICs is performed using the second input terminals RX2 and RX2N and the second output terminals TX2 and TX2N.

When the battery monitoring IC 10_2 recognizes that identification information such as an address or an ID included in the received command refers to the battery monitoring IC 10_2 itself, then the battery monitoring IC 10_2 reads the data of the cell voltage stored in the storage unit 17 of the battery monitoring IC 10_2 and outputs the read data as a response signal to the command.

The response signal outputted from the battery monitoring IC 10_2 is transmitted to the battery monitoring IC 10_1. The battery monitoring IC 10_1 outputs the response signal received from the battery monitoring IC 10_2 from the second output terminals TX2 and TX2N. The response signal outputted from the battery monitoring IC 10_1 is inputted to the input terminals RX and RXN of the second interface IC 22.

The second interface IC 22 converts the format of the received response signal from the differential signal format to the serial signal (SPI signal) format and outputs the converted signal from the data output terminal SDO. The response signal outputted from the second interface IC 22 is inputted to the data input terminal SDI of the MCU 30.

In the battery monitoring system 100 according to the present embodiment, in a case in which signal transmission is performed in the first transmission mode using the first communication path P1, for example, if there is a break in a signal line on the first communication path P1 (for example, the signal lines connecting the first output terminals TX1 and TX1N of the battery monitoring IC 10_1 to the first input terminals RX1 and RX1N of the battery monitoring IC 10_2), the transmission mode is switched to the second transmission mode using the second communication path P2. By providing redundancy for the communication path in this manner, even if a fault were to occur in one of the communication paths, as long as the other communication path can operate normally, communication can be maintained.

Before performing signal transmission in the first transmission mode or the second transmission mode, the MCU 30 first issues to the battery monitoring ICs 10_1, 10_2, and 10_3 a command to set the operation mode thereof to normal mode. When the battery monitoring ICs 10_1, 10_2, and 10_3 receive this command, they set the operation mode thereof to normal mode. Normal mode refers to an operation mode in which signals inputted to the first input terminals RX1 and RX1N or response signals thereto are outputted from the first output terminals TX1 and TX1N, and signals inputted to the second input terminals RX2 and RX2N or response signals thereto are outputted from the second output terminals TX2 and TX2N.

A case is considered below in which a fault occurs in the battery monitoring IC 10_2, and signals cannot be transmitted to or received from the battery monitoring IC 10_2. In such a case, the battery monitoring IC 10_2 cannot transmit or receive signals to/from the battery monitoring ICs 10_1 and 10_3, and thus, signal transmission in both the first transmission mode and the second transmission mode are rendered impossible. In the battery monitoring system 100 according to the present embodiment, if signal transmission in both the first transmission mode and the second transmission mode become impossible, then the transmission mode is switched to a third transmission mode.

Figure 3:
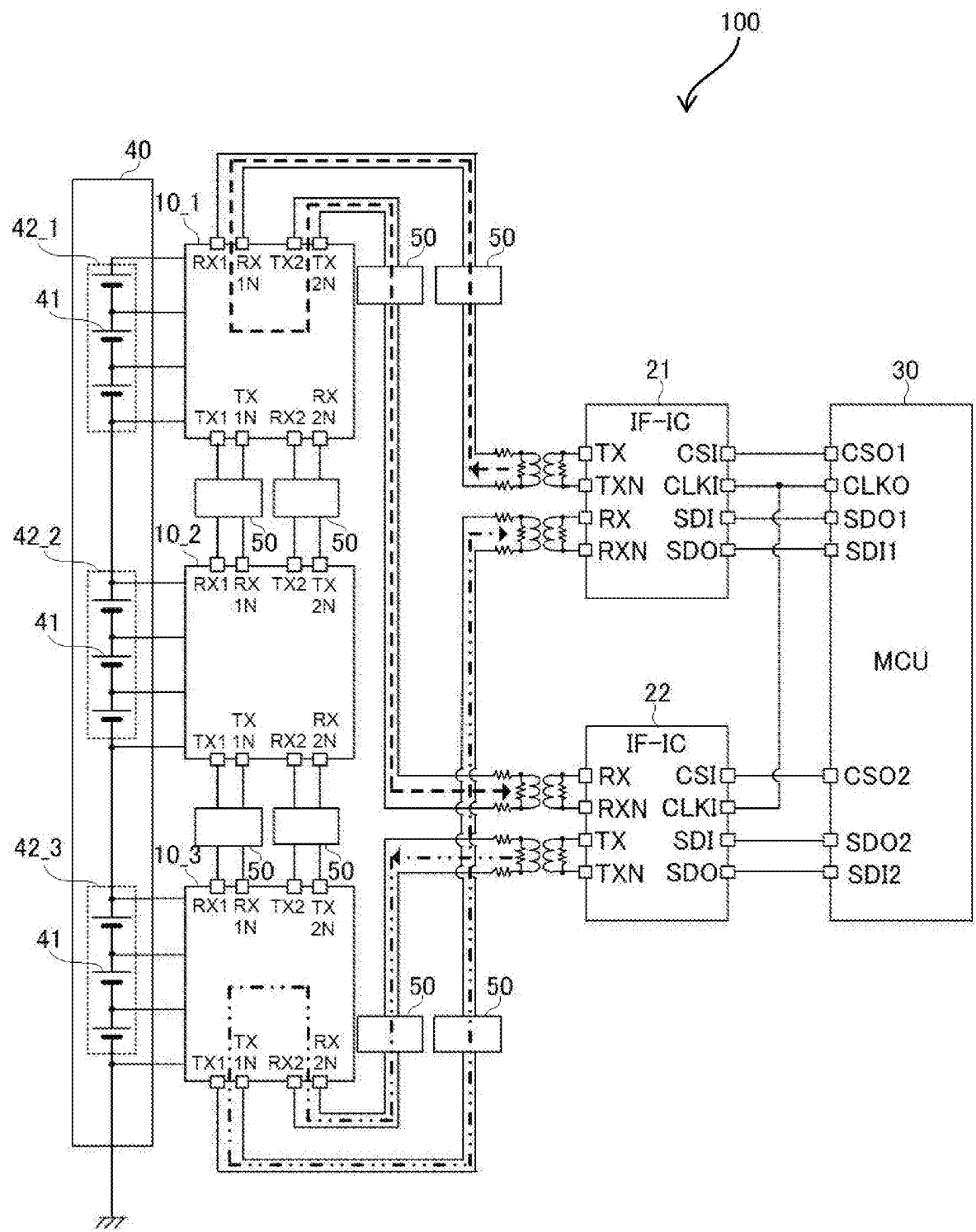
FIG. 3 shows an example of signal transmission by a third transmission mode in the battery monitoring system according to an embodiment of the present invention.

As shown in FIG. 3, the third transmission mode is a transmission mode in which a communication signal outputted from the first interface IC 21 is inputted from one end of the plurality of battery monitoring ICs, reverses course at one of the plurality of battery monitoring ICs, and is inputted to either of the first interface IC 21 and the second interface IC 22; and the communication signal outputted from the second interface IC 22 is inputted from the other end of the plurality of battery monitoring ICs, reverses course at another of the plurality of battery monitoring ICs, and is inputted to the other of the first interface IC 21 and the second interface IC 22.

In the third transmission mode, the signal reverses course at the battery monitoring ICs adjacent to the battery monitoring IC where the fault has occurred. If, for example, a fault has occurred in the battery monitoring IC 10_2 and signal transmission in both the first transmission mode and the second transmission mode becomes impossible, then prior to signal transmission by the third transmission mode, the MCU 30 issues a command to set the operation mode to course reversal mode in both the battery monitoring ICs 10_1 and 10_3, which are the course reversal points. When the battery monitoring ICs 10_1 and 10_3 receive this command, they set the operation mode thereof to course reversal mode. Course reversal mode refers to an operation mode in which signals inputted to the first input terminals RX1 and RX1N or response signals thereto are outputted from the second output terminals TX2 and TX2N, and signals inputted to the second input terminals RX2 and RX2N or response signals thereto are outputted from the first output terminals TX1 and TX1N. When the operation mode of the battery monitoring ICs 10_1 and 10_3 is set to course reversal mode, then as shown in FIG. 3, the communication signals reverse course at the battery monitoring ICs 10_1 and 10_3, thereby realizing signal transmission by the third transmission mode.

An example will be described in which a fault has occurred in the battery monitoring IC 10_2 and signal transmission is performed according to the third transmission mode when a command to read data of the cell voltage for the battery monitoring ICs 10_1 and 10_3 is issued by the MCU 30. The command issued by the MCU 30 is converted to a pair of differential signals by the first interface IC 21 and the second interface IC 22 and outputted from the output terminals TX and TXN of the first interface IC 21 and the second interface IC 22.

The differential signal-format command outputted from the first interface IC 21 is inputted to the first input terminals RX1 and RX1N of the battery monitoring IC 10_1. When the battery monitoring IC 10_1 recognizes that identification information such as an address or an ID included in the received command refers to the battery monitoring IC 10_1 itself, then the battery monitoring IC 10_1 reads the data of the cell voltage stored in the storage unit 17 of the battery monitoring IC 10_1 and outputs the read data from the second output terminals TX2 and TX2N as a response signal to the command. The response signal outputted from the battery monitoring IC 10_1 is inputted to the input terminals RX and RXN of the second interface IC 22. The second interface IC 22 converts the format of the received response signal from the differential signal format to the serial signal (SPI signal) format and outputs the converted signal from the data output terminal SDO. The response signal outputted from the second interface IC 22 is inputted to the data input terminal SDI of the MCU 30. When performing signal transmission by the third transmission mode, the MCU 30 recognizes the response signal supplied from the second interface IC 22 to be a response signal to the command transmitted through the first interface IC 21.

Meanwhile, the differential signal-format command outputted from the second interface IC 22 is inputted to the second input terminals RX2 and RX2N of the battery monitoring IC 10_3. When the battery monitoring IC 10_3 recognizes that identification information such as an address or an ID included in the received command refers to the battery monitoring IC 10_3 itself, then the battery monitoring IC 10_3 reads the data of the cell voltage stored in the storage unit 17 of the battery monitoring IC 10_3 and outputs the read data from the first output terminals TX1 and TX1N as a response signal to the command. The response signal outputted from the battery monitoring IC 10_3 is inputted to the input terminals RX and RXN of the first interface IC 21. The first interface IC 21 converts the format of the received response signal from the differential signal format to the serial signal (SPI signal) format and outputs the converted signal from the data output terminal SDO. The response signal outputted from the first interface IC 21 is inputted to the data input terminal SDI of the MCU 30. When performing signal transmission by the third transmission mode, the MCU 30 recognizes the response signal supplied from the first interface IC 21 to be a response signal to the command transmitted through the second interface IC 22.

According to the battery monitoring system 100 of the present embodiment, it is possible to identify the battery monitoring IC in which a fault has occurred. Below, an example of a method for identifying the battery monitoring IC where a fault has occurred will be described. If signal transmission by both the first transmission mode and the second transmission mode are rendered impossible, then the MCU 30 sets the operation mode of the battery monitoring IC 10_1 to course reversal mode, and supplies a test signal through the first interface IC 21 to the battery monitoring IC 10_1. If the MCU 30 was able to receive a response signal to the test signal in a normal manner, then it determines that the battery monitoring IC 10_1 is operating normally, and if the MCU 30 was unable to receive a response signal to the test signal in a normal manner, then it determines that a fault has occurred in the battery monitoring IC 10_1.

If the battery monitoring IC 10_1 is determined to be operating normally, then the MCU 30 sets the operation mode of the battery monitoring IC 10_1 to normal mode, sets the operation mode of the battery monitoring IC 10_2 to course reversal mode, and supplies a test signal to the battery monitoring IC 10_2 through the first interface IC 21. If the MCU 30 was able to receive a response signal to the test signal in a normal manner, then it determines that the battery monitoring IC 10_2 is operating normally, and if the MCU 30 was unable to receive a response signal to the test signal in a normal manner, then it determines that a fault has occurred in the battery monitoring IC 10_2.

If the battery monitoring ICs 10_1 and 10_2 are determined to be operating normally, then the MCU 30 sets the operation mode of the battery monitoring ICs 10_1 and 10_2 to normal mode, sets the operation mode of the battery monitoring IC 10_3 to course reversal mode, and supplies a test signal to the battery monitoring IC 10_3 through the first interface IC 21. If the MCU 30 was able to receive a response signal to the test signal in a normal manner, then it determines that the battery monitoring IC 10_3 is operating normally, and if the MCU 30 was unable to receive a response signal to the test signal in a normal manner, then it determines that a fault has occurred in the battery monitoring IC 10_3. The test signal can also be supplied to the battery monitoring ICs 10_1, 10_2, and 10_3 through the second interface IC 22. In such a case, the test signal is inputted to each battery monitoring IC from the battery monitoring IC 10_3.

When performing signal transmission in the third transmission mode, the MCU 30 identifies the battery monitoring IC where a fault has occurred by the above steps, and switches the operation mode to course reversal mode for each battery monitoring IC adjacent to the battery monitoring IC in which a fault is determined to have occurred.

Thus, according to the battery monitoring system 100 of an embodiment of the present invention, even if a fault occurs in one of the plurality of battery monitoring devices and signal transmission by the first transmission mode and the second transmission mode is rendered impossible, communication with battery monitoring ICs other than those in which the fault has occurred is ensured.

Figure 4:
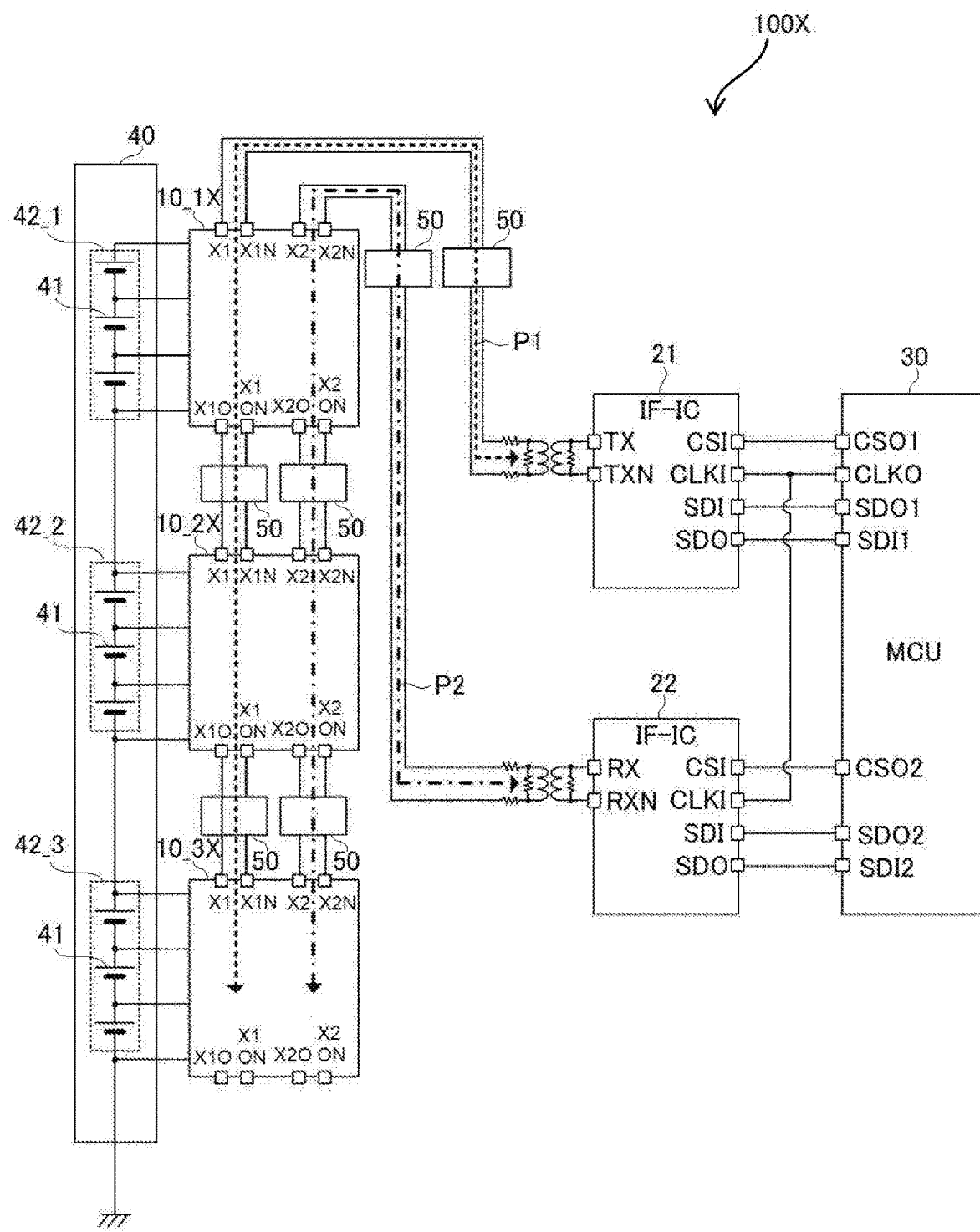
FIG. 4 shows a configuration of a battery monitoring system according to a comparison example.

FIG. 4 shows a configuration of a battery monitoring system 100X according to a comparison example. In the battery monitoring system 100X according to the comparison example, terminals X1, X1N, X1O, X1ON, X2, X2N, X2O, and X2ON provided in the battery monitoring ICs 10_1X, 10_2X, and 10_3X function as input terminals and output terminals, respectively, and signals are transmitted back and forth along one communication path. The battery monitoring system 100X of the comparison example has a first communication path P1 and a second communication path P2, and even if a break were to occur in a signal line on the first communication path P1, for example, by using the second communication path P2, the MCU 30 can communicate with the battery monitoring ICs 10_1X, 10_2X, and 10_3X. However, in the battery monitoring system 100X of the comparison example, if a fault occurs in the battery monitoring IC 10_2X, for example, then the MCU 30 would be unable to access the battery monitoring IC 10_3X.

On the other hand, according to the battery monitoring system 100 of an embodiment of the present invention, even if a fault were to occur in the battery monitoring IC 10_2, by switching the operation mode of the battery monitoring ICs 10_1 and 10_3 to course reversal mode and performing signal transmission in the third transmission mode, it is possible to access the battery monitoring ICs 10_1 and 10_3.

Embodiment 2

Figure 5:
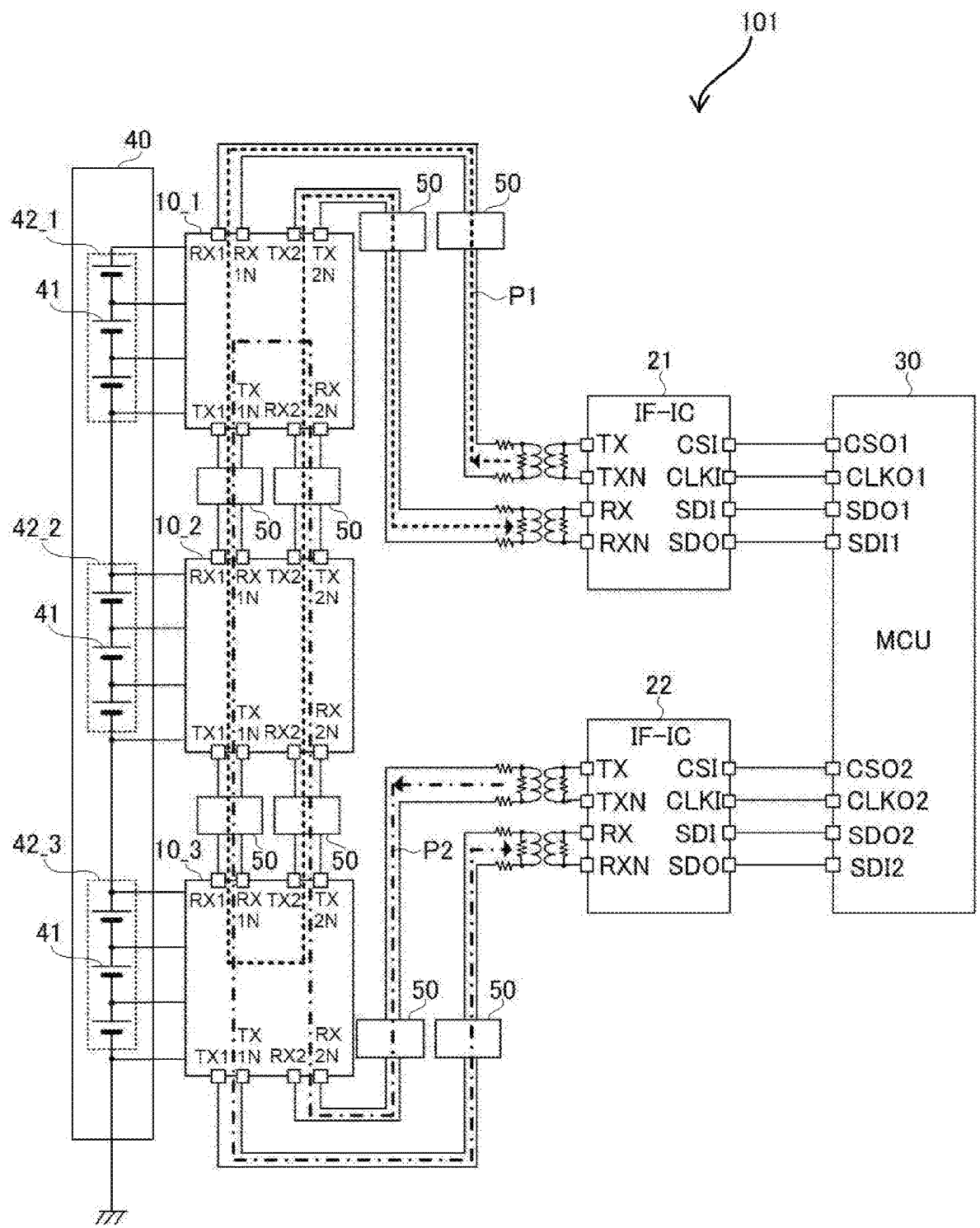
FIG. 5 shows a configuration of a battery monitoring system according to another embodiment of the present invention.

FIG. 5 shows a configuration of a battery monitoring system 101 according to Embodiment 2 of the present invention. The battery monitoring system 101 differs from the battery monitoring system 100 of Embodiment 1 in terms of the mode of connection between the battery monitoring ICs 10_1 and 10_3, and the first and second interface ICs 21 and 22. Specifically, the battery monitoring system 101 differs from the battery monitoring system 100 of Embodiment 1 in that the second output terminals TX2 and TX2N of the battery monitoring IC 10_1 are connected to the input terminals RX and RXN of the first interface IC 21, and the first output terminals TX1 and TX1N of the battery monitoring IC 10_3 are connected to the input terminals RX and RXN of the second interface IC 22.

As shown in FIG. 5, the battery monitoring system 101 includes a first communication path P1 and a second communication path P2 as communication paths for performing communication between the MCU 30 and the battery monitoring ICs 10_1, 10_2, and 10_3.

The first communication path P1 passes through the output terminals TX and TXN of the first interface IC 21, the first input terminals RX1 and RX1N of the battery monitoring IC 10_1, the first output terminals TX1 and TX1N of the battery monitoring IC 10_1, the first input terminals RX1 and RX1N of the battery monitoring IC 10_2, the first output terminals TX1 and TX1N of the battery monitoring IC 10_2, the first input terminals RX1 and RX1N of the battery monitoring IC 10_3, the second output terminals TX2 and TX2N of the battery monitoring IC 10_3, the second input terminals RX2 and RX2N of the battery monitoring IC 10_2, the second output terminals TX2 and TX2N of the battery monitoring IC 10_2, the second input terminals RX2 and RX2N of the battery monitoring IC 10_1, the second output terminals TX2 and TX2N of the battery monitoring IC 10_1, and the input terminals RX and RXN of the first interface IC 21, in the stated order. In other words, the first interface IC 21 is provided on the first communication path P1.

The second communication path P2 passes through the output terminals TX and TXN of the second interface IC 22, the second input terminals RX2 and RX2N of the battery monitoring IC 10_3, the second output terminals TX2 and TX2N of the battery monitoring IC 10_3, the second input terminals RX2 and RX2N of the battery monitoring IC 10_2, the second output terminals TX2 and TX2N of the battery monitoring IC 10_2, the second input terminals RX2 and RX2N of the battery monitoring IC 10_1, the first output terminals TX1 and TX1N of the battery monitoring IC 10_1, the first input terminals RX1 and RX1N of the battery monitoring IC 10_2, the first output terminals TX1 and TX1N of the battery monitoring IC 10_2, the first input terminals RX1 and RX1N of the battery monitoring IC 10_3, the first output terminals TX1 and TX1N of the battery monitoring IC 10_3, and the input terminals RX and RXN of the second interface IC 22, in the stated order. In other words, the second interface IC 22 is provided on the second communication path P2.

Below, an example will be described in which the signal transmission performed according to the first transmission mode using the first communication path P1 when a command to read data of the cell voltage for the battery monitoring IC 10_2 is issued by the MCU 30.

The command issued by the MCU 30 is converted to a pair of differential signals by the first interface IC 21 and outputted from the output terminals TX and TXN of the first interface IC 21. The differential signal-format command outputted from the first interface IC 21 is supplied to the battery monitoring IC 10_1. The command is transmitted from the battery monitoring IC 10_1 to the battery monitoring IC 10_2, and further transmitted from the battery monitoring IC 10_2 to the battery monitoring IC 10_3.

When the battery monitoring IC 10_2 recognizes that identification information such as an address or an ID included in the received command refers to the battery monitoring IC 10_2 itself, then the battery monitoring IC 10_2 reads the data of the cell voltage stored in the storage unit 17 of the battery monitoring IC 10_2 and outputs the read data as a response signal to the command.

The response signal outputted from the battery monitoring IC 10_2 reverses course at the battery monitoring IC 10_3 and is inputted to the input terminals RX and RXN of the first interface IC 21, through the battery monitoring ICs 10_2 and 10_1.

The first interface IC 21 converts the format of the received response signal from the differential signal format to the serial signal (SPI signal) format and outputs the converted signal from the data output terminal SDO. The response signal outputted from the first interface IC 21 is inputted to the data input terminal SDI of the MCU 30.

Next, an example will be described in which the signal transmission performed according to the second transmission mode using the second communication path P2 when a command to read data of the cell voltage for the battery monitoring IC 10_2 is issued by the MCU 30.

The command issued by the MCU 30 is converted to a pair of differential signals by the second interface IC 22 and outputted from the output terminals TX and TXN of the second interface IC 22. The differential signal-format command outputted from the second interface IC 22 is supplied to the battery monitoring IC 10_3. The command is transmitted from the battery monitoring IC 10_3 to the battery monitoring IC 10_2, and further transmitted from the battery monitoring IC 10_2 to the battery monitoring IC 10_1.

When the battery monitoring IC 10_2 recognizes that identification information such as an address or an ID included in the received command refers to the battery monitoring IC 10_2 itself, then the battery monitoring IC 10_2 reads the data of the cell voltage stored in the storage unit 17 of the battery monitoring IC 10_2 and outputs the read data as a response signal to the command.

The response signal outputted from the battery monitoring IC 10_2 reverses course at the battery monitoring IC 10_1 and is inputted to the input terminals RX and RXN of the second interface IC 22, through the battery monitoring ICs 10_2 and 10_3.

The second interface IC 22 converts the format of the received response signal from the differential signal format to the serial signal (SPI signal) format and outputs the converted signal from the data output terminal SDO. The response signal outputted from the second interface IC 22 is inputted to the data input terminal SDI of the MCU 30.

A case is considered below in which a fault occurs in the battery monitoring IC 10_2, and signals cannot be transmitted to or received from the battery monitoring IC 10_2. In such a case, the battery monitoring IC 10_2 cannot transmit or receive signals to/from the battery monitoring ICs 10_1 and 10_3, and thus, signal transmission in both the first transmission mode and the second transmission mode are rendered impossible. In the battery monitoring system 101 according to the present embodiment, if signal transmission in both the first transmission mode and the second transmission mode become impossible, then the transmission mode is switched to a third transmission mode.

Figure 6:
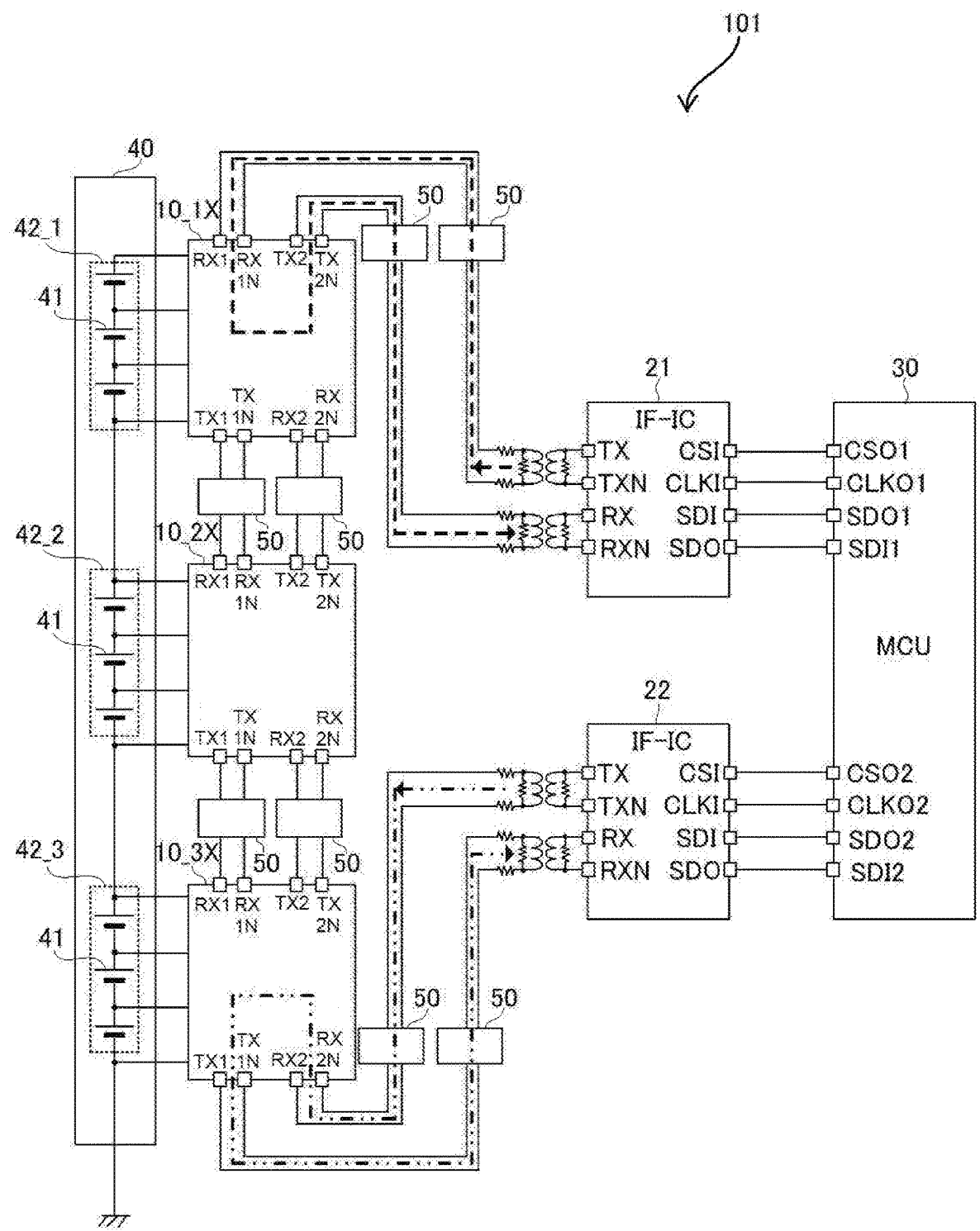
FIG. 6 shows an example of signal transmission by a third transmission mode in the battery monitoring system according to another embodiment of the present invention.

As shown in FIG. 6, the third transmission mode is a transmission mode in which a communication signal outputted from the first interface IC 21 is inputted from one end of the plurality of battery monitoring ICs, reverses course at one of the plurality of battery monitoring ICs, and is inputted to either of the first interface IC 21 and the second interface IC 22; and the communication signal outputted from the second interface IC 22 is inputted from the other end of the plurality of battery monitoring ICs, reverses course at another of the plurality of battery monitoring ICs, and is inputted to the other of the first interface IC 21 and the second interface IC 22.

In the third transmission mode, the signal reverses course at the battery monitoring ICs adjacent to the battery monitoring IC where the fault has occurred. If, for example, a fault has occurred in the battery monitoring IC 10_2 and signal transmission in both the first transmission mode and the second transmission mode becomes impossible, then prior to signal transmission by the third transmission mode, the MCU 30 issues a command to set the operation mode to course reversal mode in both the battery monitoring ICs 10_1 and 10_3, which are the course reversal points. When the battery monitoring ICs 10_1 and 10_3 receive this command, they set the operation mode thereof to course reversal mode. When the operation mode of the battery monitoring ICs 10_1 and 10_3 is set to course reversal mode, then as shown in FIG. 6, the communication signals reverse course at the battery monitoring ICs 10_1 and 10_3, thereby realizing signal transmission by the third transmission mode.

An example will be described in which a fault has occurred in the battery monitoring IC 10_2 and signal transmission performed according to the third transmission mode when a command to read data of the cell voltage for the battery monitoring ICs 10_1 and 10_3 is issued by the MCU 30.

The command issued by the MCU 30 is converted to a pair of differential signals by the first interface IC 21 and the second interface IC 22 and outputted from the output terminals TX and TXN of the first interface IC 21 and the second interface IC 22.

The differential signal-format command outputted from the first interface IC 21 is inputted to the first input terminals RX1 and RX1N of the battery monitoring IC 10_1. When the battery monitoring IC 10_1 recognizes that identification information such as an address or an ID included in the received command refers to the battery monitoring IC 10_1 itself, then the battery monitoring IC 10_1 reads the data of the cell voltage stored in the storage unit 17 of the battery monitoring IC 10_1 and outputs the read data from the second output terminals TX2 and TX2N as a response signal to the command. The response signal outputted from the battery monitoring IC 10_1 is inputted to the input terminals RX and RXN of the first interface IC 21. The first interface IC 21 converts the format of the received response signal from the differential signal format to the serial signal (SPI signal) format and outputs the converted signal from the data output terminal SDO. The response signal outputted from the first interface IC 21 is inputted to the data input terminal SDI of the MCU 30.

Meanwhile, the differential signal-format command outputted from the second interface IC 22 is inputted to the second input terminals RX2 and RX2N of the battery monitoring IC 10_3. When the battery monitoring IC 10_3 recognizes that identification information such as an address or an ID included in the received command refers to the battery monitoring IC 10_3 itself, then the battery monitoring IC 10_3 reads the data of the cell voltage stored in the storage unit 17 of the battery monitoring IC 10_3 and outputs the read data from the first output terminals TX1 and TX1N as a response signal to the command. The response signal outputted from the battery monitoring IC 10_3 is inputted to the input terminals RX and RXN of the second interface IC 22. The second interface IC 22 converts the format of the received response signal from the differential signal format to the serial signal (SPI signal) format and outputs the converted signal from the data output terminal SDO. The response signal outputted from the second interface IC 22 is inputted to the data input terminal SDI of the MCU 30.

When performing signal transmission in the third transmission mode, the MCU 30 identifies the battery monitoring IC where a fault has occurred, and switches the operation mode to course reversal mode for each battery monitoring IC adjacent to the battery monitoring IC in which a fault is determined to have occurred. The steps for identifying the battery monitoring system where a fault has occurred are similar to those of the battery monitoring system 100 according to Embodiment 1.

Thus, according to the battery monitoring system 101 of Embodiment 2 of the present invention, similar to the battery monitoring system 100 of Embodiment 1, even if a fault occurs in one of the plurality of battery monitoring devices and signal transmission by the first transmission mode and the second transmission mode is rendered impossible, communication with battery monitoring ICs other than those in which the fault has occurred is ensured.

The battery monitoring systems 100 and 101 are examples of battery monitoring systems of the present invention. The battery monitoring IC 10_1 is an example of a highest position battery monitoring device of the present invention, and is also an example of a semiconductor device of the present invention. The battery monitoring IC 10_2 is an example of a mid-position battery monitoring device of the present invention, and is also an example of a semiconductor device of the present invention. The battery monitoring IC 10_3 is an example of a lowest position battery monitoring device of the present invention, and is also an example of a semiconductor device of the present invention. The first interface IC 21 is an example of a first interface device of the present invention. The second interface IC 22 is an example of a second interface device of the present invention.

What is claimed is:

1. A battery monitoring system, comprising:
   a plurality of battery monitoring devices connected in series, such that each battery monitoring device is in communication with at least one adjacent battery monitoring device, and each battery monitoring device monitors battery cells;
   a first interface device that is provided along a first communication path that passes through each of the plurality of battery monitoring devices;
   a second interface device that is provided along a second communication path that passes through each of the plurality of battery monitoring devices and differs from the first communication path; and
   a controller configured to control the first interface device and the second interface device to switch a transmission mode between a first transmission mode in which communication signals are transmitted and received between the first interface device and the plurality of battery monitoring devices are transmitted through the first communication path, a second transmission mode in which the communication signals are transmitted and received between the second interface device and the plurality of battery monitoring devices through the second communication path, and a third transmission mode in which a direction of the communication signals outputted from the first interface device to the plurality of battery monitoring devices are reversed, and a direction of the communication signals outputted from the second interface device to the plurality of battery monitoring devices are reversed.

2. The battery monitoring system according to claim 1, wherein the controller is configured to determine whether signal transmission in both the first transmission mode and the second transmission mode becomes impossible, and, when the controller determines that signal transmission in both the first transmission mode and the second transmission mode becomes impossible, the controller is configured to switch operation of the first interface device and the second interface device to the third transmission mode.

3. The battery monitoring system according to claim 2, wherein when the controller determines that signal transmission by both the first transmission mode and the second transmission mode is impossible, the controller identifies a first battery monitoring device among the plurality of battery monitoring devices in which a fault has occurred, and the controller is configured to control the first and second interface devices to reverse the direction of the communication signals at each of the battery monitoring devices adjacent to the first battery monitoring device in which the fault is determined to have occurred.

4. The battery monitoring system according claim 1, wherein each of the plurality of battery monitoring devices includes a first input terminal, a second input terminal differing from the first input terminal, a first output terminal, a second output terminal differing from the first output terminal, and a switch, and wherein the switch is configured to switch an output destination of a response signal to a signal inputted to the first input terminal and the second input terminal to either the first output terminal or the second output terminal.

5. The battery monitoring system according to claim 4, wherein the plurality of battery monitoring devices includes a highest position battery monitoring device at one end of the plurality of battery monitoring devices connected in series,
wherein the first input terminal of the highest position battery monitoring device is connected to an output terminal of the first interface device, and the second output terminal of the highest position battery monitoring device is connected to an input terminal of the second interface device,
wherein the plurality of battery monitoring devices includes a lowest position battery monitoring device at another end of the plurality of battery monitoring devices connected in series,
wherein the first output terminal of the lowest position battery monitoring device is connected to an input terminal of the first interface device, and the second input terminal is connected to an output terminal of the second interface device,
wherein the plurality of battery monitoring devices includes at least one mid-position battery monitoring device between the highest position battery monitoring device and the lowest position battery monitoring device among the plurality of battery monitoring devices connected in series, and
wherein the first input terminal of the at least one mid-position battery monitoring device is connected to the first output terminal of a first adjacent battery monitoring device on a side closer to the highest position battery monitoring device along the first communication path, the second input terminal of the at least one mid-position battery monitoring device is connected to the second output terminal of the first battery monitoring device, the first output terminal of the at least one mid-position battery monitoring device is connected to the first input terminal of a second adjacent battery monitoring device on a side closer to the lowest position battery monitoring device along the first communication path, and the second output terminal of the at least one mid-position battery monitoring device is connected to the second input terminal of the second adjacent battery monitoring device.

6. The battery monitoring system according to claim 5, wherein the first communication path passes, consecutively, through the output terminal of the first interface device, the first input terminal of the highest position battery monitoring device, the first output terminal of the highest position battery monitoring device, the first input terminal of the at least one mid-position battery monitoring device, the first output terminal of the at least one mid-position battery monitoring device, the first input terminal of the lowest position battery monitoring device, the first output terminal of the lowest position battery monitoring device, and the input terminal of the first interface device, and
wherein the second communication path passes through the output terminal of the second interface device, the second input terminal of the lowest position battery monitoring device, the second output terminal of the lowest position battery monitoring device, the second input terminal of the mid-position battery monitoring device, the second output terminal of the mid-position battery monitoring device, the second input terminal of the highest position battery monitoring device, the second output terminal of the highest position battery monitoring device, and the input terminal of the second interface device, in the stated order.

7. The battery monitoring system according to claim 4, wherein the plurality of battery monitoring devices includes a highest position battery monitoring device at one end of the plurality of battery monitoring devices connected in series,
wherein the first input terminal of the highest position battery monitoring device is connected to an output terminal of the first interface device, and the second output terminal of the highest position battery monitoring device is connected to an input terminal of the first interface device,
wherein the plurality of battery monitoring devices includes a lowest position battery monitoring device at another end of the plurality of battery monitoring devices connected in series,
wherein the first output terminal is connected to an input terminal of the second interface device, and the second input terminal is connected to an output terminal of the second interface device,
wherein the plurality of battery monitoring devices includes at least one mid-position battery monitoring device connected in series between the highest position battery monitoring device and the lowest position battery monitoring device, and
wherein the first input terminal of the at least one mid-position battery monitoring device is connected to the first output terminal of a first adjacent battery monitoring device closer to the highest position battery monitoring device, the second input terminal is connected to the second output terminal of the first adjacent battery monitoring device, the first output terminal is connected to the first input terminal of a second adjacent battery monitoring device closer to the lowest position battery monitoring device, and the second output terminal is connected to the second input terminal of the second adjacent battery monitoring device.

8. The battery monitoring system according to claim 7,
wherein the first communication path passes, consecutively, through the output terminal of the first interface device, the first input terminal of the highest position battery monitoring device, the first output terminal of the highest position battery monitoring device, the first input terminal of the at least one mid-position battery monitoring device, the first output terminal of the at least one mid-position battery monitoring device, the first input terminal of the lowest position battery monitoring device, the second output terminal of the lowest position battery monitoring device, the second input terminal of the at least one mid-position battery monitoring device, the second output terminal of the at least one mid-position battery monitoring device, the second input terminal of the highest position battery monitoring device, the second output terminal of the highest position battery monitoring device, and the input terminal of the first interface device, and wherein the second communication path passes, consecutively, through the output terminal of the second interface device, the second input terminal of the lowest position battery monitoring device, the second output terminal of the lowest position battery monitoring device, the second input terminal of the at least one mid-position battery monitoring device, the second output terminal of the at least one mid-position battery monitoring device, the second input terminal of the highest position battery monitoring device, the first output terminal of the highest position battery monitoring device, the first input terminal of the at least one mid-position battery monitoring device, the first output terminal of the at least one mid-position battery monitoring device, the first input terminal of the lowest position battery monitoring device, the first output terminal of the lowest position battery monitoring device, and the input terminal of the second interface device.

9. The battery monitoring system according to claim 1, wherein the controller is
a control device that is connected to each of the plurality of battery monitoring devices through the first interface device and the second interface device, respectively, to allow communication signals to be transmitted from the controller to the plurality of battery monitoring devices.

10. The battery monitoring system according to claim 1, further comprising:
a battery assembly including a plurality of battery cells connected to the plurality of battery monitoring devices.

11. A signal transmission method in a battery monitoring system having a plurality of battery monitoring devices connected in series, such that each battery monitoring device is in communication with at least one adjacent battery monitoring device, and each battery monitoring device monitors battery cells the monitoring system further including a first interface device provided in a first communication path that passes through each of the plurality of battery monitoring devices and a second interface device that is provided in a second communication path that passes through each of the plurality of battery monitoring devices and differs from the first communication path, the method comprising:
determining whether signal transmission along the first communication path in a first transmission mode and along the second communication path in a second transmission mode are impossible; and
based on determining that the signal transmission is impossible in the first transmission mode and the second transmission mode, switching a transmission mode for transmitting signals to a third transmission mode in which a communication signal outputted from the first interface device is inputted to one end of the plurality of battery monitoring devices connected in series, reverses course at one of the plurality of battery monitoring devices, and is inputted to one of the first interface device and the second interface device, and a communication signal outputted from the second interface device is inputted to another end of the plurality of battery monitoring devices connected in series, reverses course at another of the plurality of battery monitoring devices, and is inputted to another of the first interface device and the second interface device.

12. A semiconductor device, comprising:
a processing unit that performs processing to measure a cell voltage of a battery cell connected to the semiconductor device;
a first input terminal;
a second input terminal different from the first input terminal;
a first output terminal;
a second output terminal differing from the first output terminal, the first input terminal, second input terminal, first output terminal, and second output terminal communicating with an external device; and
a switch configured to switch an output destination of a response signal to a signal inputted to the first input terminal and the second input terminal to either the first output terminal or the second output terminal.

* * * * *